Inventors:
Robert N. Hall;
Nick Holonyak, Jr.,
by Joseph V. Claeys
Their Attorney.

Inventors:
Robert N. Hall;
Nick Holonyak, Jr.,
by Joseph V. Claeys
Their Attorney.

United States Patent Office 3,417,248

Patented Dec. 17, 1968

3,417,248

TUNNELING SEMICONDUCTOR DEVICE EXHIBITING STORAGE CHARACTERISTICS

Robert N. Hall, Schenectady, N.Y., and Nick Holonyak, Jr., Urbana, Ill., assignors to General Electric Company, a corporation of New York Continuation-in-part of application Ser. No. 182,775, Mar. 27, 1962. This application Apr. 26, 1965, Ser. No. 453,876

10 Claims. (Cl. 250—211)

ABSTRACT OF THE DISCLOSURE

A semiconductor device containing a narrow P-N junction which exhibits tunneling has deep-level trapping states formed within the space charge region of the junction. The device exhibits an enduring change in its tunneling current-voltage characteristics in response to applied energy in the form of a short duration voltage pulse or incident radiation.

This application is a continuation-in-part of our copending application, Ser. No. 182,775, now abandoned, filed Mar. 27, 1962, and assigned to the present assignee. This invention relates to semiconductor devices and more particularly to such devices which are capable of exhibiting enduring changes in their electrical characteristics in response to applied energy of short time duration and also to solid state storage devices and apparatus.

It is an object of this invention to provide a new semiconductor device.

It is another object of this invention to provide a semiconductor device whose electrical characteristics may be changed for an enduring period in response to applied energy of short duration.

It is still another object of this invention to provide solid state storage devices and apparatus particularly adapted for use in electronic computer memory arrays utilizing optical read-out.

It is a further object of this invention to provide a new semiconductor device which combines storage, switching and amplifying capabilities in a single unit.

It is a still further object of this invention to provide a new semiconductor device which exhibits tunneling and wherein the tunneling current thereof may be modulated.

Briefly stated, in accordance with one aspect of this invention, the semiconductor device comprises a body of low resistivity semiconductive material including therein a narrow P-N tunneling junction having deep-level trapping states within the space charge region thereof and separate nonrectifying electrodes in contact with the body on opposite sides of the junction.

The novel features believed characteristic of this invention are set forth with particularity in the appended claims. The invention itself, however, both as to its organization and method of operation, together with further objects and advantages thereof, may best be understood by reference to the following description taken in conjunction with the accompanying drawing in which:

FIGURE 8 is a cross-sectional view of another embodiment of the semiconductor device of this invention; and FIGURE 9 is a cross-sectional view of a modification of the semiconductor device of FIGURE 8.

Figures 1, 2, 3:
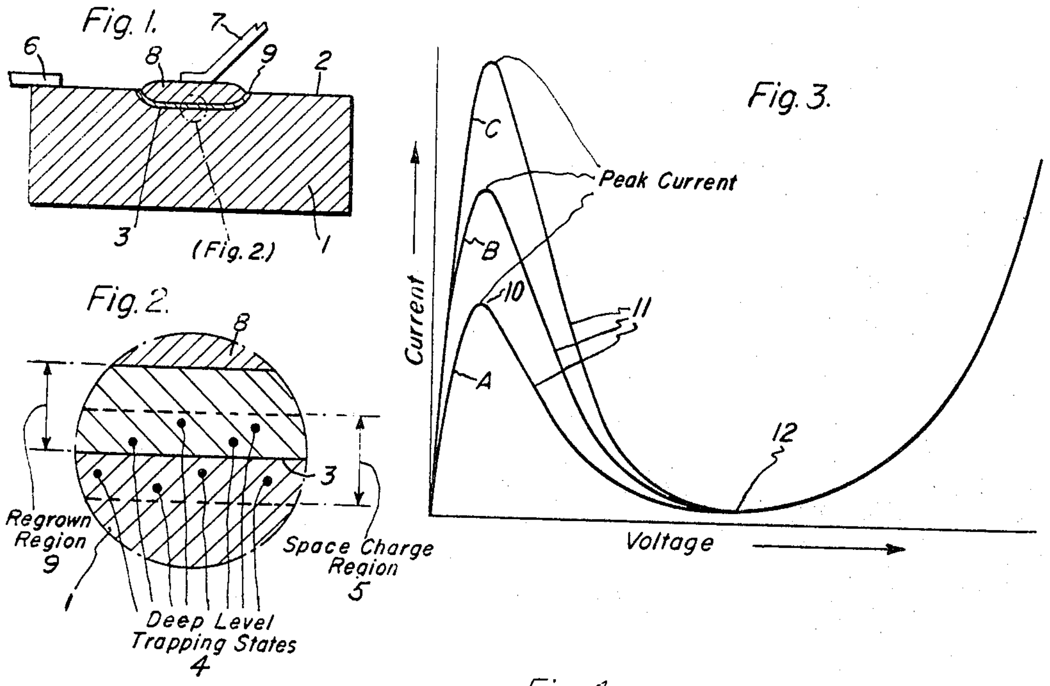
FIGURE 1 is a cross-sectional view of one embodiment of the semiconductor device of this invention.
FIGURE 2 is a very greatly enlarged diagrammatic view of a portion of the junction and space charge region of the device of FIGURE 1.
FIGURE 3 illustrates typical current-voltage characteristics of devices of this invention illustrating one type of effect on the electrical characteristics which may be exhibited by such devices in response to applied energy.

In FIGURE 1 there is shown a semiconductor device embodying the principles of this invention. In this specific illustrative embodiment, the invention comprises a body 1 of semiconductive material of one conductivity type, at least a portion of whose thickness, for example the portion contiguous on surface 2, is of degenerate material. The body 1 further includes an abrupt P-N junction 3, which exhibits tunneling, and deep-level trapping states, shown diagrammatically at 4 in FIGURE 2, within the space charge region 5 of the junction. Electrodes 6 and 7 are provided in nonrectifying contact on opposite sides of the P-N tunneling junction.

The term "degenerate" refers to a body or region of semiconductive material which, if N-type contains a sufficient concentration of excess donor impurity to raise the Fermi-level thereof to a value of energy higher than the minimum energy of the conduction band; and, if P-type, a sufficient concentration of excess acceptor impurity to depress the Fermi-level to an energy lower than the maximum energy of the valence band. In nondegenerate semiconductive material, the Fermi-level lies in the energy between the conduction and valence bands.

Specifically, in the embodiment shown in FIGURE 1, the body 1 of semiconductive material has incorporated therein sufficient conductivity type determining impurity to render it degenerate and of one-type conductivity throughout its bulk. In addition, body 1 has incorporated therein a deep-level impurity material or defect to establish therein deep-level trapping states. A nonrectifying connection 6 is provided to body 1 such as by connecting a piece of platinum or fernico thereto with an appropriate solder which will not alter the conductivity type of the body. Such procedure is well-known in the art. Attached to the surface 2 of body 1 is another contact 8 which forms a rectifying connection with the surface-adjacent region thereof. The contact material is originally placed on the surface 2 in the form of a dot or pellet and heated to cause the alloying to the body 1 and the formation of a regrown region 9 of opposite conductivity type to that of body 1. Regrown region 9 is separated from the remainder of body 1 by a narrow rectifying junction 3 which exhibits tunneling. Further, the space charge region of junction 3 contains deep-level trapping states 4. The deep-level trapping states and their location within the space charge region of P-N tunneling junction 3 are shown more clearly in the enlarged portion of the junction illustrated in FIGURE 2.

P-N junction devices wherein an abrupt, narrow tunneling junction separates two regions of degenerate, opposite conductivity type semiconductive material are well-known in the art as tunnel diode-type devices and usually exhibit a current-voltage characteristic having a current maximum and a negative resistance region in the low forward voltage range. A typical current-voltage characteristic of such a P-N tunneling junction is shown at A in FIGURE 3. The current maximum shown by reference numeral 10 in FIGURE 3 is often more commonly referred to as the "peak current." The negative resistance region of the characteristic is shown generally at 11.

In further accord with this invention, the device must include deep trapping states 4 within the space charge region 5 of the P-N tunneling junction. Changing the population of these deep trapping states, such as by emptying or filling them with electrons, produces modulation of the tunneling current of the narrow tunneling junction. We have discovered, for example, that the population of these deep trapping states may be changed by applying appropriate energy to the junction. We have further discovered that this population change may be produced by the application of such energy of very short time duration to produce an enduring change in the electrical characteristics of the junction.

In one mode of operation, the foregoing storage characteristics of the semiconductor device of this invention are obtained by applying energy in the form of a short duration voltage pulse. The voltage pulse should have a magnitude greater than that corresponding to the peak current and preferably at least as great as that corresponding to the forward injection condition of the tunneling junction. The forward injection region of a typical tunneling junction is shown generally in FIGURE 3 by the region beyond reference numeral 12. The P-N tunneling junction functions largely by the carrier injection mechanism, therefore, at voltages in excess of about this value and by the quantum mechanical tunneling mechanism at voltages below, and sometimes somewhat above, this value.

In another mode of operation, the storage characteristics of the device are obtained by applying energy to the tunneling junction in the form of incident radiation, preferably having energy less than the energy gap of the semi-conductive material within which P-N tunneling junction is formed, but of sufficient energy to excite carriers from a deep trapping state within the space charge region of the junction to the conduction or the valence band, or from an adjacent region into empty traps in the junction.

The required deep trapping states within the space charge region of the junction may be due to deep-level impurities, vacancies, dissolved gases, or, in the case of compound semiconductive materials, deviations in the stoichiometric composition thereof, or a combination of such effects or flaws in general. Where appropriate, therefore, the deep trapping states may be produced within the space charge region of the junction by any one or a combination of the foregoing. For example, deep-level trapping states within the space charge region of the junction may be provided by incorporating deep-level impurities in the semiconductive material in addition to conductivity type determining impurities. Examples of suitable deep-level impurities for establishing deep trapping states in various semiconductive materials are: the transition metals, such as manganese, iron, cobalt and nickel; members of the copper group such as copper, silver and gold; and members of the zinc group such as zinc, cadmium and mercury. The specific impurity employed will depend upon the particular semiconductive material utilized as will the nature of the deep trapping state established thereby. For example, if the deep-level impurity is a multiple acceptor-type impurity in the particular semiconductive material, a "hole trap" is established. Similarly, if the deep-level impurity is a multiple donor-type impurity in a particular semiconductive material, an "electron trap" is established. Similar deep electron or hole traps are established within the space charge region of the junction by vacancies or other deviations from the stoichiometric composition of a compound semiconductive material or by the presence within the semiconductive material of a dissolved gas such as oxygen.

The devices of this invention, including deep-level trapping states within the space charge region of a narrow tunneling junction, are found to exhibit enduring changes in their electrical characteristics in response to applied energy. More specifically, the tunneling current of the tunneling junction is significantly and enduringly altered. This alteration may be manifested as an increase or decrease in the peak current value of the device, a "hump" in the negative resistance region of the current-voltage characteristic or as a distinct displacement in the negative resistance region. In the latter case the negative resistance region may be displaced about 0.1 volt or more. Moreover, depending upon the semiconductive material from which the device is fabricated and the ambient temperature, the duration of this change in electrical characteristics may be in the range of a small fraction of a second to hours or even days.

In accord with our invention, sufficient deep level trapping states are provided so that a change in the population of these states by carriers due to the application of energy in appropriate form changes the tunneling current characteristic in the junction. To change the current by a factor large enough to provide a readily useable effect, for example by a factor of two, the space-charge concentration must be changed by several percent. In order to achieve a change of this amount in the concentration level, the number of deep level trapping states available for emptying or filling must be of the same order, that is, several percent of the impurity concentration level. Specifically, the number of deep level trapping states should be in the range of from one percent to twenty percent of the smaller of the respective conductivity-determining impurity concentrations on the opposing sides of the junction. Since the impurity concentrations provided in typical tunnel diode junctions are usually on the order of $10^{19}$ atoms per cubic centimeter, the concentration of the deep level trapping states may be on the order of $10^{18}$ states per cubic centimeter. The concentration required in any given case depends on the particular materials in the diode and on the magnitude of the effect required for the application in question.

For example, a particular gallium arsenide device, comprising deep-level trapping states within the space charge region of its narrow P-N tunneling junction, may exhibit a current voltage characteristic such as shown at A in FIGURE 3. When this device is biased for the first time to, or beyond, the forward injection region of its current-voltage characteristic at liquid nitrogen temperature, the peak current thereof is increased as shown by curve B in FIGURE 3. When the same device is subjected to incident radiation, such as by illumination from a tungsten filament lamp, the increase in peak current thereof is as shown by the curve C. Further, after the device has been subjected to incident radiation so as to produce the increased peak current as shown by curve C, applying a forward bias voltage thereto greater than the voltage corresponding to the peak current of the device results in the device returning to an equilibrium condition exhibiting a characteristic which corresponds essentially to that shown at B. For example, the device may be subjected to incident radiant energy to cause an increase in its peak current and then returned to a steady state condition having a lower peak current by application of an appropriate forward bias. At liquid nitrogen temperature these observed peak current changes in a gallium arsenide device may endure for several hours, while at room temperature the similar changes may endure for only a small fraction of a second. Longer storage times may be obtained at room temperature with devices fabricated from suitable semiconductive materials or with suitable trap-forming impurities.

Figure 4:
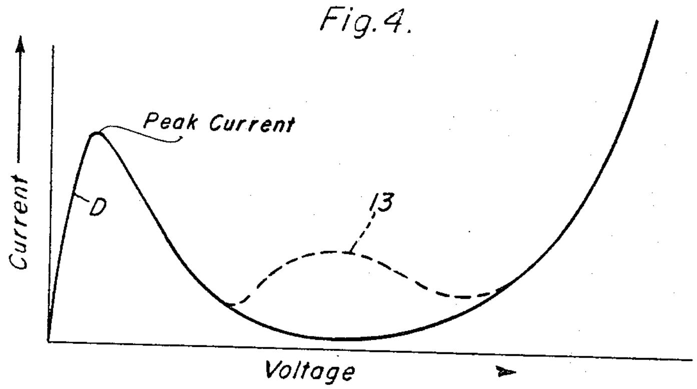
FIGURE 4 illustrates a different type of effect on the electrical characteristics which may be exhibited by the devices of the invention in response to applied energy.

Although in the foregoing illustrative example the change in the electrical characteristics of the device manifested itself as an increase in the peak current, it is to be understood that depending upon the semiconductive material and the nature and position of the deep-level trapping states within the space charge region of the junction, the changes in the tunneling current of the junction may manifest themselves as increases or decreases in the peak current value as well as various alterations of the negative resistance region. For example, a similar device, having deep-level trapping states of different type and position within the space charge region of the P-N tunneling junction, may initially exhibit a typical current-voltage characteristic such as D in FIGURE 4. When the device is subjected to applied energy, such as a short duration voltage pulse of magnitude greater than that corresponding to the peak current thereof, an enduring alteration in the electrical characteristics of the device is produced which manifests itself as a distinct "hump" 13 in the current-voltage characteristics.

The new semiconductor devices of this invention, therefore, which comprise a tunneling junction having deep-level trapping states within the space charge region thereof, are capable of exhibiting various enduring changes in one or more of their electrical characteristics in response to applied energy of much shorter time duration. For example, the applied energy may have a duration of about one microsecond or less, depending upon the magnitude thereof, with the resulting change in electrical characteristics enduring for several hours or even days, depending upon the temperature, semiconductive materials, and nature and position of the deep trapping states within the space charge region of the junction.

Figure 5:
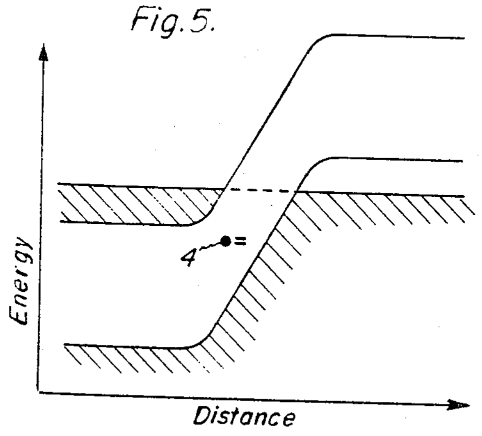
FIGURES 5–7 are illustrative energy diagrams of a typical device embodying the principles of this invention.
Figure 6:
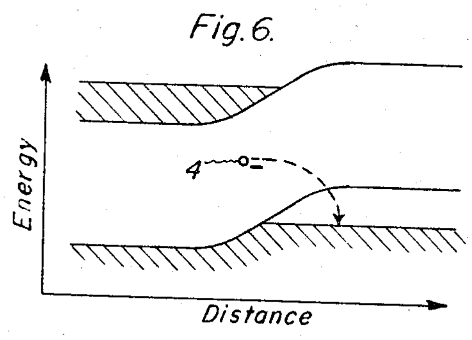
Figure 7:
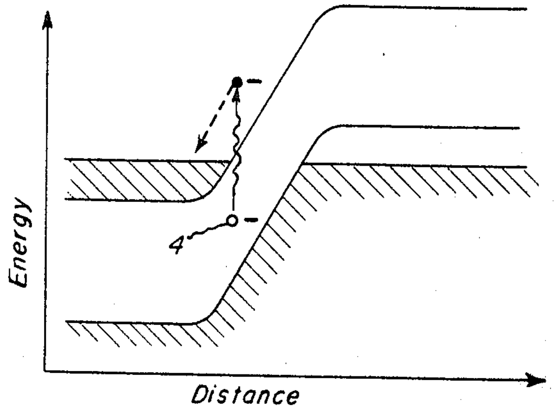
Figure 7:
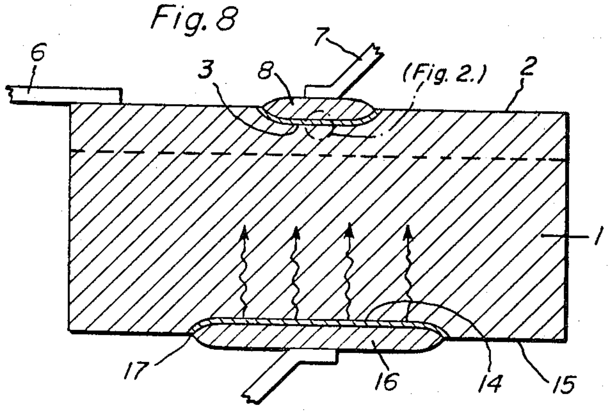
Figure 7:
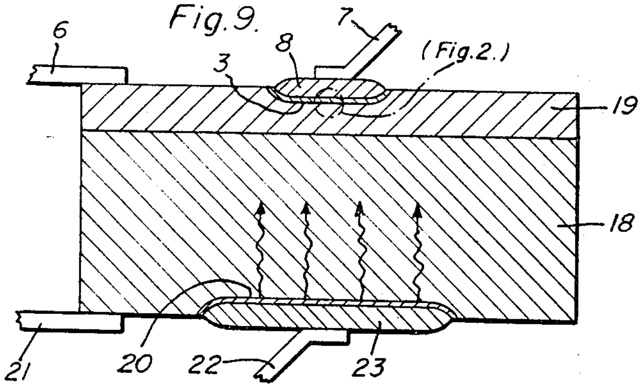

The nature and function of the deep-level trapping states within the space charge region of the junction in the device of this invention are still further illustrated by the energy diagram of FIGURES 5–7. FIGURE 5 shows the energy diagram of a narrow P-N tunneling junction region containing a deep-level trapping state 4 in the space charge region thereof. Deep-level trapping state 4 is shown as a double acceptor on the N-type side of the junction and, as such, functions as a hole trap. Such a double acceptor trapping state may be due, for example, to a copper impurity in a material such as gallium arsenide. FIGURE 5 represents the condition of the junction with zero bias voltage. FIGURE 6 shows the effect of an applied voltage greater than that corresponding to the forward injection region of the junction. As shown, the trapped carrier is released, due to the applied voltage, enabling it to leave the higher energy level of trapping state 4 and enter the valence band. When the voltage is removed, however, the initial condition of the filled trapping state does not occur immediately, resulting in an enduring change in the charge condition and electrical characteristics of the junction.

In like manner, the energy diagram of FIGURE 7 shows that the trapped carrier in trapping state 4, within the space charge region of the junction, may be excited to the conduction band in response to incident radiant energy, such as by illuminating the junction with light from a conventional tungsten filament lamp, for example. Again, there will be a significant delay before the initial trapping condition is attained after removal of the radiant energy.

For simplicity of explanation in the foregoing illustrations the deep trapping state was shown within, and on only one side of, the space charge region. It is to be understood, however, that although such deep trapping states must be within, and on at least one side of the space charge region of the junction, they may also be disposed within, and throughout the entire space charge region.

In FIGURE 8 there is shown another semiconductor device embodying the principles of this invention. The device shown in FIGURE 8 is similar to that shown in FIGURE 1 but comprises, preferably on the opposite surfaces from the tunneling junction, an additional P-N junction capable of emitting radiation in response to an applied voltage. In this embodiment, however, only a portion of body 1 is of degenerate material, for example, the portion contiguous the surface 2.

The device shown in FIGURE 8, therefore, utilizes the foregoing described effects of the change in electrical characteristics to provide a "tunnel triode." As shown, the device comprises a body 1 of low resistivity, one conductivity type, semiconductive material including a portion contiguous surface 2 which is degenerate. A first P-N tunneling junction 3 is established within the degenerate portion which junction contains deep trapping states

4 within the space charge region 5 thereof as shown in detail in FIGURE 2. Electrodes 6 and 7 are provided in nonrectifying contact to body 1 on opposite sides of the P-N junction 3. For example, electrode 6 may be connected as shown to the surface 2 of body 1 while electrode 7 is connected to contact 8. In addition, body 1 includes a second P-N junction 14 preferably on the opposite surface 15 thereof. P-N junction 14 is capable of emitting radiation in response to an applied voltage. Junction 14 may be similarly formed by the alloy method wherein an opposite conductivity type determining impurity, originally in the form of a dot or pellet, is alloyed to the surface 15 of the body 1 to form a contact 16 which forms a rectifying connection to the surface adjacent region thereof by formation of a regrown region 17 of opposite conductivity type. Since the portion of body 1 wherein regrown region 17 is formed is nondegenerate, the junction 14 is not a tunneling junction but is so formed to assure the emission of radiant energy in response to an applied voltage, which energy can pass through body 1 to tunneling junction 3 with a minimum amount of loss. The effect of this radiation from junction 14 on the first tunneling junction 3, which contains deep trapping states within the space charge region, is to cause the deep trapping states to become electrically charged. This charge of the deep-level trapping states results in the modulation of the tunneling current of the device.

FIGURE 9 illustrates another embodiment of the "tunnel triode" device of FIGURE 8. In FIGURE 9 a semiconductive body 18 has deposited thereon a layer 19 of a different semiconductive material. Layer 19 may be, for example, an epitaxially deposited layer prepared in accordance with well-known processes. Preferably, but not necessarily, layer 19 is a material having a wider energy gap than that of body 18. For example, body 18 may be of gallium arsenide and layer 19 a wider energy gap material, such as mixed compound of gallium arsenophosphide ($GaAs_xP_{1-x}$). A layer of such a mixed semiconductive compound or other compound semiconductive material may be deposited on body 18 in accordance with the method disclosed and claimed in the application of Nick Holonyak, Jr., Ser. No. 134,903, filed Aug. 30, 1961, and assigned to the assignee of the present invention. In accordance with that method, a free halogen, or a halogen supplied by a metal halide, is used in a closed-tube process to transport and grow epitaxial layers of intermetallic compounds or mixed intermetallic compounds.

The layer 19 is suitably impregnated with a conductivity type determining impurity to render it degenerate and of one conductivity type. If formed in accordance with the above method of the Holonyak invention, and a metal halide is employed, the doping impurity may be introduced along with the halogen necessary for transport purposes. For example, $ZnCl_2$ and $CdCl_2$ have been used in the above method to transport gallium arsenide and dope it degenerately P-type. P-N junctions which exhibit tunneling have thereafter been formed in such material in conventional manner.

As described hereinbefore in accordance with this invention, a deep-level impurity or defect is incorporated into the semiconductive material of layer 19 to establish therein deep-level trapping states. The body further includes a P-N tunneling junction 3 which contains the deep trapping states 4 within the space charge region 5 thereof. A second P-N junction 20 is established in the nondegenerate body of semiconductive material, preferably located opposite the tunneling junction 3. Separate electrodes 6, 7, 21 and 22 are connected in nonrectifying contact to the semiconductive material on opposite sides of tunneling junction 3 and "radiation emitting" junction 20 respectively. For example, electrode 6 may be connected to the surface of layer 19 and electrode 7 may be connected to contact 8, which is in rectifying connection to layer 19 and forms therewith a junction which exhibits tunneling. Similarly, electrode 21 may be connected to the surface of body 18 and electrode 22 may be connected to rectifying contact 23.

The junction 20 is not a tunneling junction but one which emits radiation in response to applied voltage. Since in the preferred embodiment the semiconductive material of body 18 has a narrower energy gap than that of the layer 19, the radiation emitted from junction 20 has less energy than that of the forbidden gap of the semiconductive material in which tunneling junction 3 is established. The radiation of junction 20, however, has sufficient energy to excite carriers from the deep trapping states 4 to the conduction or valence band thereby causing modulation of the tunneling current of the tunneling junction.

Alternatively, the radiation emitting junction may be provided by epitaxially growing a layer 19 of a different semiconductive material, one constituent element of which is a conductivity-type determining impurity for the semiconductive material of body 18. Incorporation of this impurity into a portion adjacent the surface of body 18 renders that portion of opposite conductivity type thereby establishing a "radiation emitting" P-N junction at the interface 18–19. For example, a layer of gallium arsenide of one conductivity type may be epitaxially deposited upon a body of germanium. Incorporation of gallium into the surface portion of the germanium body establishes opposite conductivity type therein and forms a P-N "radiation emitting" junction at the interface between layer 19 and the surface of body 18.

Deep-level trapping states may be produced within a suitable body or region of semiconductive material in various different conventional ways. The following examples are given by way of illustration of some suitable techniques of preparing appropriately impregnated semiconductive bodies which contain deep-level trapping states such that a P-N tunneling junction formed therein contains deep-trapping states within the space charge region. For clarity and simplicity, such examples are given with respect to gallium arsenide semiconductive material only, however, since these are illustrative examples given as an aid in understanding this invention, they are not to be construed in a limiting sense since the principles of this invention are not limited to any specific semiconductive material.

*Example I*

A degenerate P-type conductivity body of gallium arsenide containing about $4\times10^{19}$ atoms of zinc per cubic centimeter and deep-level trapping states in the nature of vacancies and misplaced arsenic or gallium atoms is prepared from a melt comprising about 5 grams of gallium, 1 gram of arsenic and 0.6 gram of zinc at a temperature of about 1000° C. Slowly cooling the melt in accordance with well-known techniques results in the growth of a degenerate P-type conductivity gallium arsenide body including the deep-level trapping states. A narrow P-N tunneling junction is formed within the body by alloying a pellet of tin to one surface thereof to form the degenerate regrown N-type conductivity region within the surface-adjacent region of the body. The P-N tunneling junction so formed contains trapping states within the space charge region thereof. Suitable electrodes are provided in nonrectifying contact to the regrown region and the remainder of the body. The device exhibits significant and enduring changes in its tunneling current characteristic in response to applied energy in the form of a suitable voltage pulse of about 1 microsecond duration as well as in the form of radiation from a conventional tungsten filament lamp for a similar short period.

*Example II*

A body of gallium arsenide impregnated with about $4\times10^{19}$ zince atoms per cubic centimeter to render it degenerate and of P-type conductivity has a thin layer of a deep-level impurity material, such as copper, gold or manganese deposited upon one surface thereof. The body is thereafter heated in a hydrogen atmosphere to a temperature of about 900° C. for about 4 hours to diffuse the deep-level impurity into the surface-adjacent region thereof and establish therein deep-level trapping states. The P-N tunneling junction is established in the body in a manner similar to that shown in Example I. Again the device exhibits significant and enduring changes in its electrical characteristics in response to applied energy. For example, the device was subjected to a forward voltage in excess of that corresponding to its peak current and a current "hump" 13 was exhibited, as shown on the current-voltage characteristic in FIGURE 4.

*Example III*

A degenerate P-type conductivity gallium arsenide body containing about $4\times10^{19}$ atoms of zinc per cubic centimeter and deep trapping states, due to vacancies misplaced gallium or arsenic, or dissolved oxygen, is prepared from a melt at about 1100° C. in a sealed, evacuated envelope. The melt comprises about 5 grams gallium, 1.7 grams arsenic, 0.7 gram zinc and about 100 milligrams gallium oxide. The melt is slowly cooled to room temperature resulting in the growth of a gallium arsenide crystal of degenerate P-type conductivity and containing deep-level trapping states. The alloy P-N tunneling junction is established in the body as in Example I. This device also exhibits significant and enduring changes in its electrical characteristics such as shown in FIGURE 2, in response to applied energy.

There has been described hereinbefore new semi-conductor devices, comprising a P-N tunneling junction having deep trapping states within the space charge region thereof, which are capable of exhibiting enduring changes in their electrical characteristics. The enduring changes may be initiated by applied energy either in the form of radiation of sufficient energy to excite carriers from deep trapping states to the conduction or valence band, or in the form of an applied voltage having a magnitude greater than the voltage corresponding to the peak current of the tunneling junction and preferably having a magnitude at least as great as the voltage corresponding to the forward injection region thereof. Further, an enduring change in the electrical characteristics of such devices may be initiated by such applied energy of very short duration.

While the invention has been described in detail herein with reference to specific examples utilizing specific semiconductive materials by way of illustration, many changes and modifications will occur to those skilled in the art. It is, therefore, to be understood that the appended claims are intended to cover all such changes and modifications as fall within the true spirit and scope of the invention.

What we claim as new and desire to secure by Letters Patent of the United States is:

1. A semiconductor device comprising: a body of semiconductive material including therein a P-N junction which exhibits tunneling, said junction containing sufficient deep-level trapping states located within the space charge region thereof to change the tunneling current characteristic of said junction in response to an energy pulse applied thereto.

2. A semiconductor device comprising: a body of semiconductive material including therein a P-N junction which exhibits tunneling, said junction containing a number of deep-level trapping states in the range of from $10^{17}$ to $2\times10^{18}$ states per cubic centimeter; said trapping states being located within the space charge region of said junction to change the tunneling current characteristic of said junction in response to an energy pulse applied thereto.

3. A semiconductor device comprising: a body of semiconductive material including a rectifying junction which exhibits tunneling; said body including predetermined concentrations of opposite conductive-type carriers on the respective sides of said junction; and a plurality of deep-level trapping states located within the space charge region of said junction for changing the tunneling current characteristic thereof in response to an energy pulse applied thereto; the concentration of said deep-level trapping states being in the range of from one percent to 20 percent of the smaller of said concentrations of opposite conductivity-type carriers.

4. A semiconductor device comprising: a body of semiconductive material having a first portion which is degenerate and contains deep-level trapping states; a first P-N junction formed within the degenerate portion of said body, said first junction exhibiting tunneling and having sufficient deep-level trapping states located within the space charge region of said first junction to change the tunneling current characteristic of said first junction in response to energy applied thereto; a second P-N junction adapted to emit radiation toward said first junction for changing said characteristic of said first junction in response to an applied voltage, said second junction being formed in a second portion of said body; and conductor means making non-rectifying contact to the semiconductive material on opposite sides of said first and second P-N junctions respectively.

5. The device claimed in claim 4 wherein said first P-N junction is defined by regions of opposing conductivity-type carriers of predetermined concentrations and wherein said deep-level trapping states are present in the range of from one percent to 20 percent of the smaller of said carrier concentrations.

6. A semiconductor device comprising: a body of semiconductive material of one-type conductivity; a first rectifying junction adapted to emit radiant energy in response to an applied voltage, said first rectifying junction being disposed on and within one surface of said body; a layer of semiconductive material having impregnated therein a high concentration of a conductive-type determining impurity and including deep-level trapping states, said layer being disposed adjacent the opposite surface of said body, the semiconductive material of said layer having a wider band-gap than that of said body; a second rectifying junction formed within said layer, said second rectifying junction exhibiting tunneling and containing sufficient of said deep-level trapping states within the space charge region thereof to change the tunneling current characteristic of said second junction in response to radiant energy received from said first junction; and conductor means making nonrectifying contact to the semiconductive material on opposite sides of said first and second junctions respectively.

7. The semiconductor device of claim 6 wherein said body comprises gallium arsenide and said layer comprises a mixed crystal of gallium arseno-phosphide.

8. A solid state storage device comprising: a body of semiconductive material including therein a narrow P-N junction which exhibits tunneling and which contains sufficient deep-level trapping states located within the space charge region thereof to control the electrical characteristics of said device; and means for applying energy of short time duration to said P-N junction to change the electron population of said deep-level trapping states and thereby effect an enduring change in the electrical characteristics of said device.

9. The solid state storage device of claim 8 wherein said applied energy comprises incident radiation having energy sufficient to excite carriers out of said trapping states in said semiconductive material but being at a level less than the energy gap of said semiconductive material.

10. A solid state storage device comprising: a body of semiconductive material including a narrow rectifying junction between adjacent regions having predetermined concentrations of opposite conductivity-type carriers; said junction exhibiting tunneling and containing deep-level trapping states located within the space charge region thereof to control the electrical characteristics of said device, the concentration of said trapping states being in the range of from one percent to 20 percent of the lower of said concentrations of opposing conductivity-type carriers; and means for applying energy of short time duration to said P-N junction to change the electron population of said deep-level trapping states to effect an enduring change in the electrical characteristics of said device.

References Cited

UNITED STATES PATENTS

| | | | |
|---|---|---|---|
| 3,024,140 | 3/1962 | Schmidlin. | |
| 3,043,958 | 7/1962 | Diemer | 250—211 |
| 3,069,604 | 12/1962 | Ruehrwein | 317—234 |
| 3,134,905 | 5/1964 | Pfann | 250—211 |

RALPH G. NILSON, *Primary Examiner.*

T. N. GRIGSBY, *Assistant Examiner.*